United States Patent

Wolkowicz et al.

[11] Patent Number: 5,886,763
[45] Date of Patent: Mar. 23, 1999

[54] LCD HEATER UTILIZING Z-AXIS CONDUCTIVE ADHESIVE TO ATTACH BUS BARS TO ITO

[75] Inventors: Joseph A. Wolkowicz; Richard L. Schneider, both of Livonia; James C. Modrak, Lake Orion; Timothy Ewald, Ann Arbor, all of Mich.

[73] Assignee: OIS Optical Imaging Systems, Inc., Northville, Mich.

[21] Appl. No.: 941,222

[22] Filed: Sep. 26, 1997

[51] Int. Cl.⁶ .................................................... G02F 1/13
[52] U.S. Cl. ............................................. 349/161; 349/21
[58] Field of Search ............................... 349/161, 58, 56, 349/20, 21

[56] References Cited

U.S. PATENT DOCUMENTS

| 4,093,355 | 6/1978 | Kaplit et al. . |
| 4,119,842 | 10/1978 | Hayden et al. . |
| 4,206,501 | 6/1980 | Brooks . |
| 4,623,222 | 11/1986 | Itoh et al. . |
| 4,643,525 | 2/1987 | Haim . |
| 4,655,551 | 4/1987 | Washizuka et al. . |
| 4,721,363 | 1/1988 | Inoue . |
| 4,723,835 | 2/1988 | Franklin . |
| 4,772,100 | 9/1988 | Suenaga . |
| 4,773,735 | 9/1988 | Ukrainsky et al. . |
| 4,775,221 | 10/1988 | Baumgartner, Jr. . |
| 4,836,651 | 6/1989 | Anderson . |
| 4,862,153 | 8/1989 | Nakatani et al. . |
| 4,958,911 | 9/1990 | Beiswenger et al. . |
| 4,987,289 | 1/1991 | Bishop et al. . |
| 5,029,984 | 7/1991 | Adachi et al. . |
| 5,054,891 | 10/1991 | Higa et al. . |
| 5,059,767 | 10/1991 | Marks et al. . |
| 5,088,806 | 2/1992 | McCartney et al. ............. 349/161 |
| 5,115,278 | 5/1992 | Maruta et al. . |
| 5,155,612 | 10/1992 | Adachi et al. . |
| 5,164,849 | 11/1992 | Evans et al. . |
| 5,168,384 | 12/1992 | Genba . |
| 5,243,453 | 9/1993 | Kawaguchi et al. . |
| 5,247,374 | 9/1993 | Terada . |
| 5,448,037 | 9/1995 | Takase et al. . |
| 5,523,873 | 6/1996 | Bradford, III et al. . |
| 5,559,614 | 9/1996 | Urbish et al. . |
| 5,742,366 | 4/1998 | Imoto ............................. 349/161 |
| 5,777,594 | 7/1998 | Miyawaki ....................... 349/161 |

Primary Examiner—William L. Sikes
Assistant Examiner—Kenneth Parker
Attorney, Agent, or Firm—Joseph A. Rhoa

[57] ABSTRACT

An LCD heater includes a substantially transparent conductive heater layer (e.g. ITO) deposited on a transparent sheet. Attached to the conductive layer are a pair of tin coated bus bars, each of which is adhered to the conductive layer via a Z-axis conductive adhesive that reduces thermal stresses induced on solder connections between the bus bars and wires soldered thereto.

7 Claims, 5 Drawing Sheets

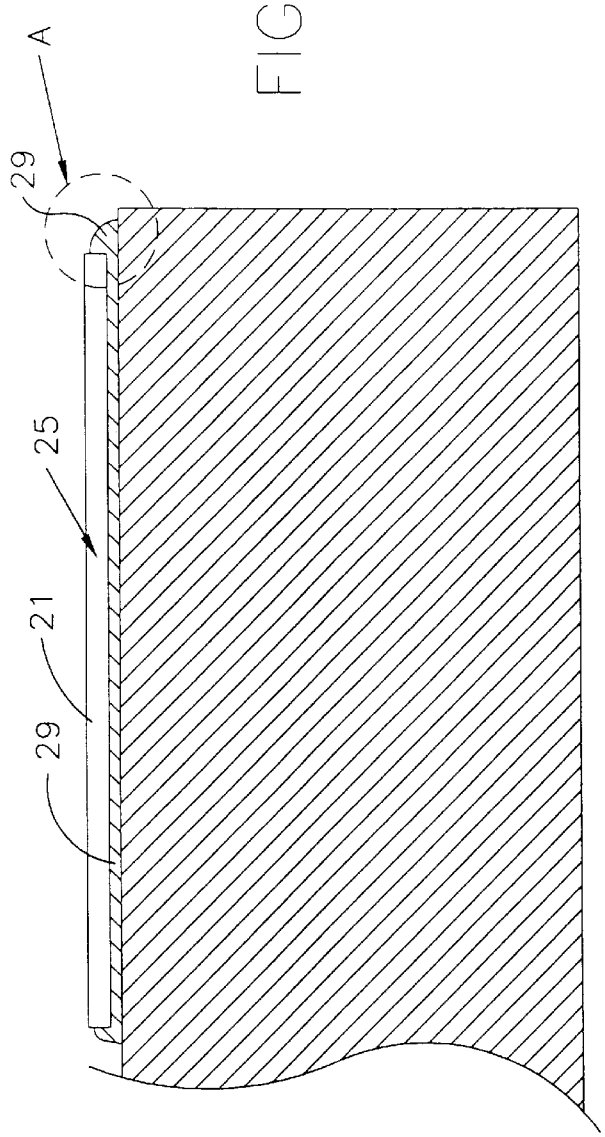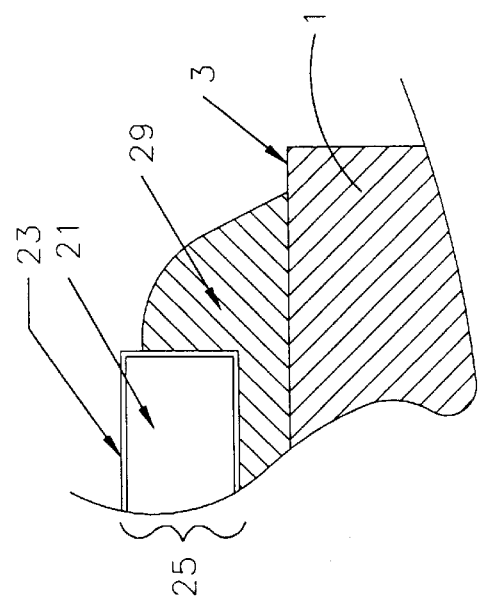

LCD HEATER UTILIZING Z-AXIS CONDUCTIVE ADHESIVE TO ATTACH BUS BARS TO ITO

This invention relates to a heater for a liquid crystal display. More particularly, this invention relates to an LCD heater including bus bars attached to a conductive heater member via a flexible Z-axis conductive adhesive.

BACKGROUND OF THE INVENTION

Liquid crystal displays (LCDs) have found widespread usage in the prior art, one such display being, for example, of the twisted nematic liquid crystal type. Such LCDs operate by applying an alternating voltage potential between opposing electrodes sandwiching a liquid crystal layer therebetween. Twisted nematic LCDs used, for example, in cockpits of air vehicles typically include a matrix array of pixels and a corresponding backlight for illuminating the elements. These pixels are often temperature dependent with respect to their normal operating characteristics in that an LCD relies upon the behavioral characteristics of its twisted nematic layer as it is exposed to driving voltages. Because such voltage-related behavior of the liquid crystal (LC) is a function of temperature, the overall performance of the corresponding display is temperature dependent. When below a predetermined temperature, twisted nematic LC material does not behave in a consistent manner. Accordingly, the LC material in such situations must be heated to a predetermined temperature in order to achieve satisfactory functionality.

LCD heaters are known in the art. For example, see U.S. Pat. Nos. 4,643,525; 4,727,835; 5,247,374; and 5,523,873.

LCD heaters, including a conductive ITO coating deposited on a transparent glass substrate, are old and well-known in the art. In such heaters, the indium tin oxide (ITO) heater coating is typically energized by way of a pair of parallel bus bars aligned along a planar surface of the ITO. Such bus bars have typically been made of either silkscreened conductive epoxy or deposited metal, the deposited metal including, for example, a tri-layer combination of chrome, nickel, and gold. Other conventional heater bus bars have been composed of a silver frit (fired silver) deposited onto a piece of glass, with an ITO layer then deposited over the entire surface. Other bus bars have been fabricated using silver epoxy, thin film gold, thin film platinum, ultrasonic indium, and flexible circuitry.

Unfortunately, silver frit bus bars are costly and require special expensive indium solder to be used to attach wires to it. This special solder is expensive, and thus undesirable. Prior art heaters where the silver bus bars are deposited directly onto the glass are undesirable due to thermal stresses created in the silver-to-solder joint when the heater is turned on. It is these thermal stresses that create the need for the special indium solder used to connect the wires to the bus bars. It has been found that wires attached with normal conventional solder (e.g. SN63)often fall off during evaluation testing.

Accordingly, there exists a need in the art for an LCD heater including bus bars attached to a conductive film, wherein the presence or effect of thermal stresses are substantially reduced or even eliminated. Furthermore, there exists a need in the art for a cost effective heater which satisfies the above-listed needs, and may be implemented with conventional non-special solder, and overcomes step coverage reliability problems.

SUMMARY OF THE INVENTION

Generally speaking, this invention fulfills the above-described needs in the art by providing a liquid crystal display comprising:

first and second polarizers sandwiching a liquid crystal layer therebetween;

electrode means for applying a voltage across the liquid crystal layer;

a heater for heating the liquid crystal layer, the heater including a heating conductive layer with first and second bus bars mounted thereon;

each of the first and second bus bars including a metallic material that forms the majority of the bus bars, and a conductive protective coating that is coated on the metallic material; and wherein a Z-axis conductive adhesive is utilized to adhere each of the first and second bus bars to the heating conductive layer so as to reduce thermal stresses induced on solder connections between the bus bars and the wires soldered thereto.

This invention further fulfills the above-described needs in the art by providing a method of making a liquid crystal display, the method comprising the steps of:

providing a liquid crystal display including a liquid crystal layer;

providing a heater for heating the liquid crystal layer, the heater being made by: (i) providing a conductive heating layer on a transparent substrate; and (ii) adhering bus bars to the heating conductive layer by way of a flexible Z-axis conductive adhesive so as to reduce thermal stresses induced on solder connections between the bus bars and wires that are to be soldered thereto.

This invention will now be described with respect to certain embodiments thereof, accompanied by certain illustrations wherein:

IN THE DRAWINGS

FIG. 3 is a side cross-sectional view of a bus bar adhered to supporting ITO-coated glass via a flexible Z-axis conductive adhesive according to certain embodiments of this invention.

FIG. 4 is an enlarged side cross-sectional view of area A of FIG. 3, showing the bus bar adhered to the ITO-coated glass with the encapsulating flexible adhesive.

DETAILED DESCRIPTION OF CERTAIN EMBODIMENTS OF THIS INVENTION

Figure 1A:
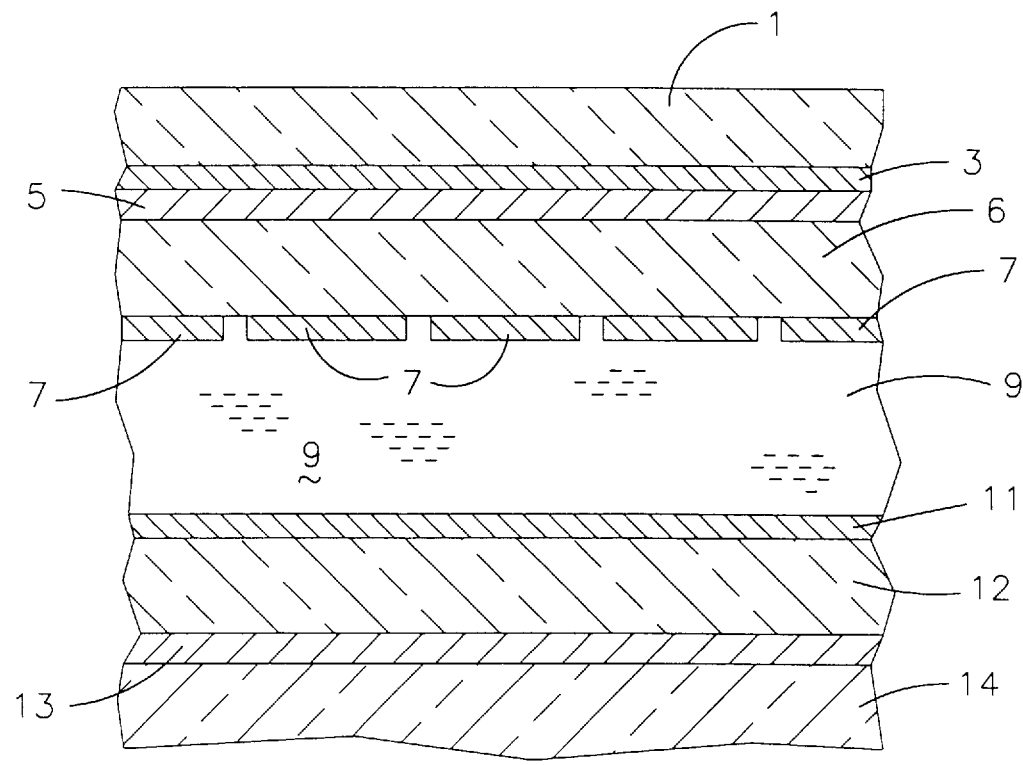
FIG. 1(a) is side cross-sectional view of a liquid crystal display (LCD) including a heater according to an embodiment of this invention.
Figure 1A:
Figure 1B:
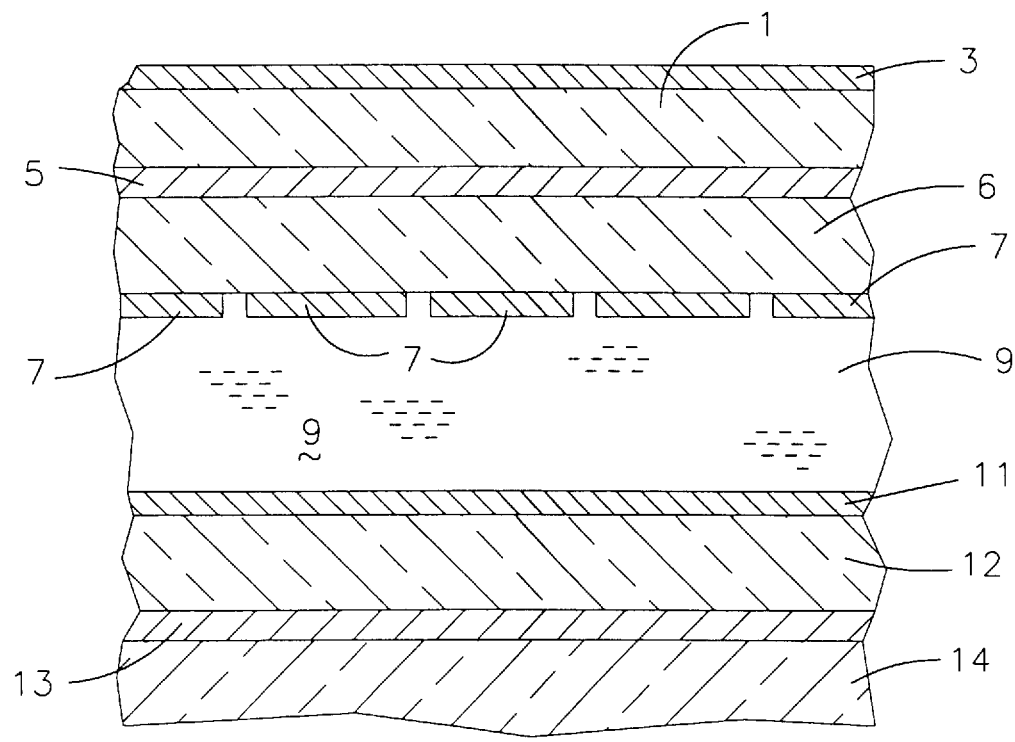
FIG. 1(b) is a side cross-sectional view of an LCD including a heater according to another embodiment of this invention.
Figure 1B:

Referring now more particularly to the accompanying drawings in which like reference numerals indicate like parts throughout the several views.

FIG. 1(a) is a side cross-sectional view of a liquid crystal display (LCD) according to an embodiment of this invention. The display includes from the rear forward toward the viewer, rear transparent glass cover sheet (substrate) 1, conductive heating layer 3 preferably made of a substantially transparent material such as indium tin oxide (ITO), rear polarizer 5, rear transparent glass substrate 6, individual LCD pixel electrodes 7, twisted nematic liquid crystal (LC) layer 9, common electrode 11, front transparent glass substrate 12, front linear polarizer 13, and front glass cover sheet 14. As illustrated, the viewer views images which are transmitted outwardly from the pixels of the LCD.

FIG. 1(*b*) illustrates another embodiment of this invention where the ITO-coated glass is inverted relative to the FIG. 1(*a*) embodiment. Thus, in the FIG. 1(*b*) embodiment, glass layer 1 is sandwiched between LC layer 9 and ITO heating layer 3, so that the heater wires can simply be attached to the rear surface of the LCD.

Figure 2A:
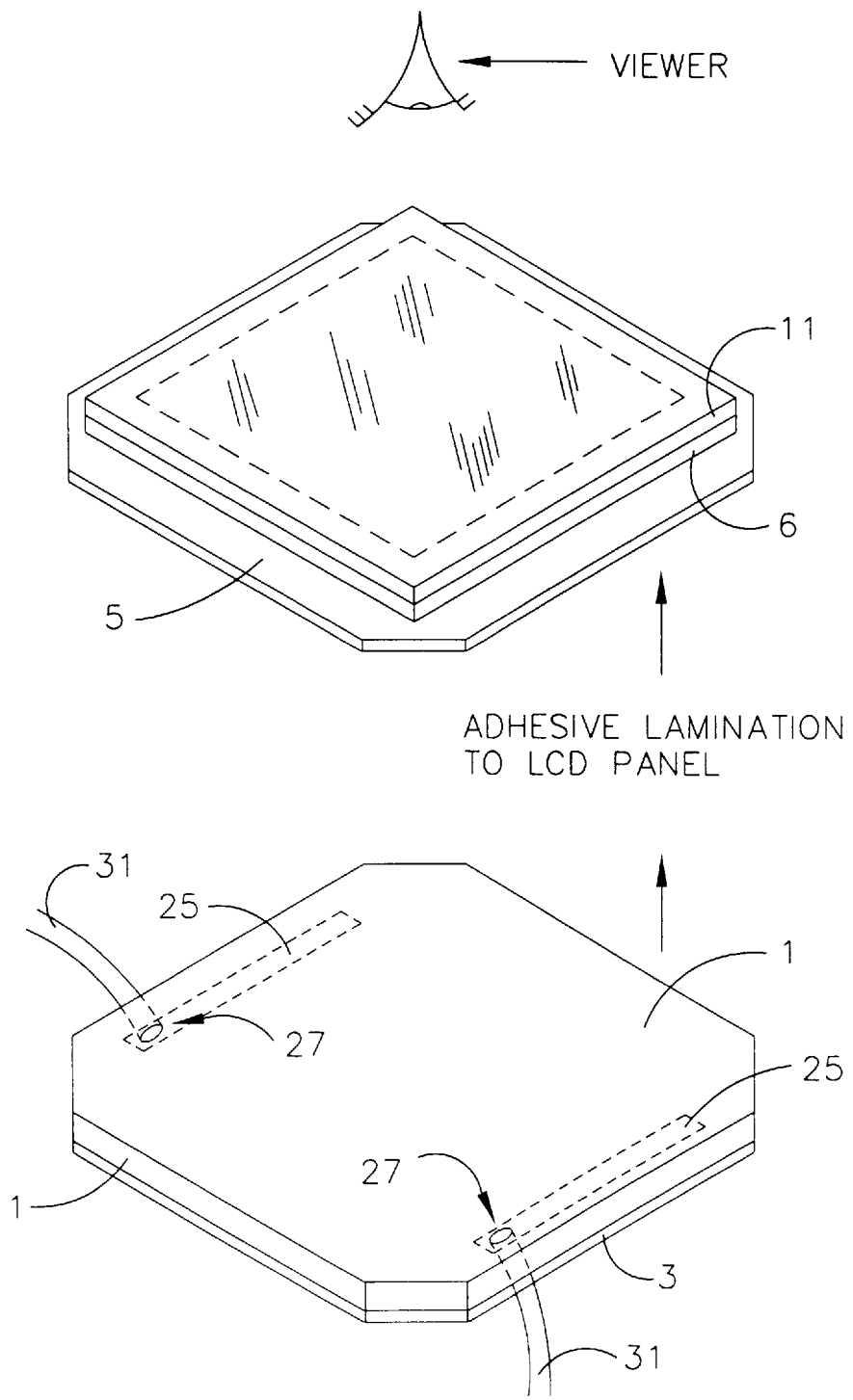
FIG. 2(a) is an exploded perspective view of a heater assembly and corresponding display according to the FIG. 1(b) embodiment of this invention.
Figure 2B:
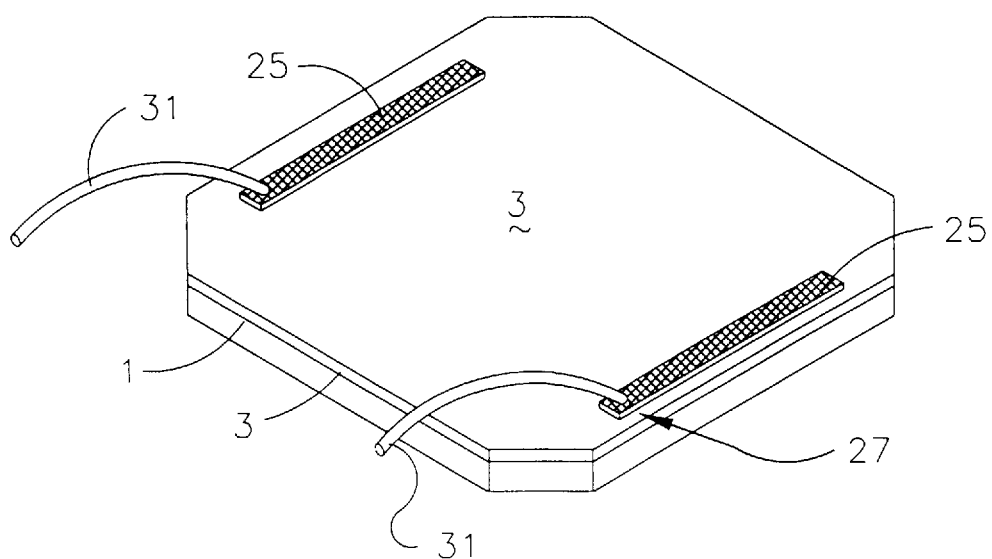
FIG. 2(b) is a perspective view of the ITO-coated glass from FIG. 2(a), as viewed from below. The FIG. 2(b) ITO-coated glass may be used in either the FIG. 1(a) or the FIG. 1(b) embodiment of this invention, depending upon which way the ITO-coated glass is oriented relative to the LC cell.

FIG. 2(*a*) illustrates the FIG. 1(*b*) embodiment. With reference to FIG. 2(*a*) and FIGS. 3–4, conductive ITO heater layer 3 is first deposited onto transparent glass rear cover sheet 1, in a conventional manner, preferably via a vapor deposition process in which the ITO is disposed on glass sheet 1. A piece of conductive metallic material such as copper in the shape of a bus bar, preferably from about 0.001"–0.005" thick (most preferably about 0.002" thick) 21 is coated with a thin conductive protective metallic coating (e.g. tin coating) 23. Tin (e.g. Sn or $SnO_2$) coating 23, in certain embodiments, is from about 100–200 microinches thick. Two separate bus bars 25 are made in such a manner. These bus bars are then adhered to layer 3.

FIG. 2(*b*) illustrates the transparent cover sheet 1 coated with ITO heater layer 3, in a position inverted relative to its position illustrated in FIG. 2(*a*). As will be recognized, the ITO-coated glass sheet shown in FIG. 2(*b*) may be utilized in either the FIG. 1(*a*) embodiment of this invention, or the FIG. 1(*b*) embodiment of this invention, depending upon how the FIG. 2(*b*) heating structure is oriented. When the FIG. 2(*b*) heating structure is laminated to the LC cell so that cover sheet 1 is disposed between heating layer 3 and the liquid crystal material, then we have the FIG. 1(*b*) embodiment. However, when the FIG. 2(*b*) heating structure is laminated to the LC cell such that ITO layer 3 is disposed between the liquid crystal layer and glass sheet 1, then we have the FIG. 1(*a*) embodiment of this invention. The FIG. 1(*b*) embodiment is preferable.

Referring to FIGS. 2(*a*), 2(*b*), 3, and 4, the resulting bus bars 25, each including the base conductive material 21 and protective conductive coating 23, are then attached to transparent conductive ITO heater layer 3 using a flexible Z-axis conductive adhesive 29. Flexible adhesive 29 allows for thermal mismatch between ITO 3 and metallic bus bars 25, while maintaining electrical connection therebetween. Adhesive 29 includes a thermosetting adhesive material. In certain embodiments, this flexible adhesive 29 may be obtained from 3M as Model No. 5303R. This adhesive includes a plurality of small conductive plastic metal-coated particles which allow electrical communication in only one axis (i.e. the Z-axis). Thus, current mainly only flows vertically between ITO layer 3 and the bus bars, and not horizontally to any great extent.

In order to activate Z-axis adhesive 29, you must have heat (e.g. bonding head is 240° C. for fifteen seconds to bring adhesive temperatures up, and then held at 220° C. for twenty-seven seconds). Thus a TAB bonding machine and process are used to adhere each of the two bus bars 25 to heater layer 3 via adhesive 29. Tin coating 23 on copper 21 provides a protective coating for the copper and also promotes solderability for wire 31 attachment to bus bars 25. Wires 31 may be attached to bus bars 25 at wire attachment areas 27, or at any other convenient place. When current is applied to heater layer 3 via wires 31 and bus bars 25, layer 3 functions to heat up the LCD, and the liquid crystal layer therein.

The Z-axis conductive adhesive 29 acts as a buffer between the thermal mismatch of the tin coated copper bus bars 25 and the ITO 3 covered glass 1, thereby reducing thermal stresses induced on solder connections between wires 31 and bus bars 25. This allows wires 31 to be attached to bus bars 25 using normal SN63 solder, while the conductive particles in flexible adhesive 29 maintain the electrical connection between layer 3 and the conductive bus bars. All of this occurs, of course, while the conductive particles in adhesive 29 maintain the electrical connection between ITO 3 and the bus bars thereby allowing the display to be heated via heater layer 3.

Optionally, for LCDs where wires are attached to the ends of bus bars 25, an indium alloy solder #281[Indium Corp., Utica, N.Y.], may be used in order to improve end bonding characteristics.

As set forth above, preferably, the main body of each bus bar 25 includes copper material 21, which is then coated with a tin (e.g. tin or tin oxide) coating 23. It is noted that these materials are merely exemplary, and other materials known in the art may also be utilized.

A key feature to this invention is the use of Z-axis conductive adhesive 29 to attach each bus bar to ITO 3. As a result of utilizing such an adhesive 29, wires 31 may be attached to bus bars 25 utilizing conventional SN63 solder in conjunction with a soldering iron temperatures set at a 275° C. level, which is lower than conventional soldering temperatures. As shown in FIGS. 3–4, the adhesive 29 encapsulates the sides of the bus bars to a substantial extent.

Potential attachment of bus bars 25 to ITO heater layer 3 after LC cell lamination may help eliminate bus bar caused polarizer distortions. However, preferably, the bus bars are laminated to the ITO layer 3 prior to LC cell lamination. This invention also substantially reduces step coverage reliability problems.

This invention is surprisingly better than using an epoxy non-Z-axis conductive adhesive to attach bus bars to ITO, because such adhesives are too rigid and often could not adequately handle temperature extremes or thermal mismatches.

In certain embodiments of this invention, adhesive 29, when purchased, is in strip form and has a thickness of approximately 0.001 inches. Following compression and setting between the bus bars and ITO layer 3, adhesive 29 has a cured thickness of approximately 0.0004" (preferably from about 0.0002"–0.0010" thick).

With respect to optical characteristics, adhesive 29 is opaque. It is also noted that adhesive 29 is utilized to bond the bus bars to ITO heater layer 3 outside of the viewing area of the LCD.

As discussed above, it is important that adhesive 29 be flexible so as to reduce the effect of thermal stresses between the bus bars and ITO heater layer 3. Pointedly, adhesive 29 must be flexible enough so that the thermal stresses between ITO layer 3 and bus bars 25 do not cause delamination (separation of a bus bar from ITO heater layer 3)of the bus bars from layer 3 when the heater unit is exposed to high and low service temperatures. For example, Applicants have found that adhesive 29 is flexible enough so that when the illustrated unit is placed in a cold chamber having a temperature of approximately −55° C., and the heater is turned on and off approximately five hundred times, leaving it on and/or off for five minute intervals, delamination does not occur.

Likewise, adhesive 29 is flexible enough so that the unit does not delaminate when it is subject to thermal shock when the unit is transferred from a −55° C. chamber to a +850° C. chamber, three cycles of transfer being utilized. In the thermal shock tests, the unit was present within each chamber for a period of one hour between transfers.

Once given the above disclosure, therefore, various other modifications, features, or improvements will become apparent to the skilled artisan. Such other features, modifications, and improvements are thus considered a part of this invention, the scope of which is to be determined by the following claims.

We claim:

1. A liquid crystal display comprising:

first and second polarizers sandwiching a liquid crystal layer therebetween;

electrode means for applying a voltage across said liquid crystal layer;

a heater for heating said liquid crystal layer, said heater including a heating conductive layer with first and second bus bars adhered thereto;

each of said first and second bus bars including a metallic material that forms the majority of each bus bar, and a conductive coating that is coated on said metallic material; and wherein a flexible Z-axis conductive adhesive is utilized to adhere each of said first and second bus bars to said heating conductive layer so as to reduce thermal stresses induced on solder connections between said bus bars and wires soldered thereto, said Z-axis adhesive including a plurality of conductive particles therein and allowing current flow in substantially only the Z-axis direction between the heating conductive layer and the bus bars.

2. The liquid crystal display of claim 1, wherein said conductive coating is from about 100–200 microinches thick.

3. The liquid crystal display of claim 2, wherein said coating includes tin.

4. The liquid crystal display of claim 1, wherein said metallic material that forms the majority of the bus bars is shaped in the form of said bus bars, and is from about 0.001"–0.005" thick.

5. A method of making a liquid crystal display, the method comprising the steps of:

providing a substantially transparent substrate;

forming a substantially transparent heating conductive layer on said substantially transparent substrate;

utilizing a Z-axis conductive adhesive to adhere first and second bus bars to the heating conductive layer;

connecting at least one conductive wire to each of said first and second bus bars; and providing the substantially transparent substrate, heating conductive layer, and bus bars on a display including liquid crystal material therein; and applying current or voltage to the bus bars so as to heat the heating conductive layer thereby heating the liquid crystal material.

6. The display of claim 1, wherein said adhesive is from about 0.0002 to 0.0010 inches thick after curing between the bus bars and the heating conductive layer.

7. The display of claim 1, wherein said Z-axis adhesive is flexible enough so that delamination between the bus bars and the heating layer does not occur when the display is subjected to −55° C. temperature for at least one thousand minutes and when subjected to said temperature is turned on and off repeatedly 500 times.

* * * * *